United States Patent
Keech

(10) Patent No.: US 12,549,136 B2
(45) Date of Patent: Feb. 10, 2026

(54) PREAMPLIFIER SYSTEM

(71) Applicant: OHM Audio, LLC, Dalton, MA (US)

(72) Inventor: Stephen Hopkins Keech, Dalton, MA (US)

(73) Assignees: OHM Audio, LLC, Dalton, MA (US); Donald J. Shumacher, Great Barrington, MA (US); Stephen Hopkins Keech, Dalton, MA (US)

( * ) Notice: Subject to any disclaimer, the term of this patent is extended or adjusted under 35 U.S.C. 154(b) by 141 days.

(21) Appl. No.: 18/618,283

(22) Filed: Mar. 27, 2024

(65) Prior Publication Data

US 2024/0333229 A1    Oct. 3, 2024

Related U.S. Application Data

(60) Provisional application No. 63/492,705, filed on Mar. 28, 2023.

(51) Int. Cl.
*H03F 1/26*      (2006.01)
*H04R 3/00*     (2006.01)

(52) U.S. Cl.
CPC ............. *H03F 1/26* (2013.01); *H04R 3/00* (2013.01); *H03F 2200/03* (2013.01); *H04R 2410/03* (2013.01); *H04R 2430/01* (2013.01)

(58) Field of Classification Search
CPC ........ H03F 1/26; H03F 3/187; H03F 3/45475; H03F 2200/03; H04R 3/00; H04R 2410/03; H04R 2430/01
(Continued)

(56) References Cited

U.S. PATENT DOCUMENTS

2006/0147060 A1    7/2006   Shyu et al.
2008/0075306 A1    3/2008   Poulsen et al.
(Continued)

OTHER PUBLICATIONS

International Search Report and Written Opinion issued in related Application Serial No. PCT/US2024/021669 on Jul. 10, 2024.

*Primary Examiner* — Paul Kim
(74) *Attorney, Agent, or Firm* — Brian J. Colandreo; Holland & Knight LLP

(57) ABSTRACT

A noise-reducing preamp system includes: a power supply circuit configured to provide electrical power to the noise-reducing preamp system and including a 0 volt reference; a signal amplification circuit including: a preamplifier circuit having an external reference input terminal and configured to receive an analog input signal, and a variable gain controller circuit configured to control the gain of the preamplifier circuit, wherein the signal amplification circuit is configured to amplify the analog input signal to generate an analog amplified signal; and a DC offset and biasing circuit coupled to the preamplifier circuit and the 0 volt reference of the power supply circuit, the DC offset and biasing circuit configured to: receive the 0 volt reference as a feedback signal, process the analog amplified signal to remove a DC offset and generate an analog output signal, and provide the analog output signal to the external reference input terminal of the preamplifier circuit of the signal amplification circuit; wherein the noise-reducing preamp system is configured to provide the analog amplified signal to an external device.

23 Claims, 2 Drawing Sheets

(58) Field of Classification Search
USPC .......................................................... 381/94.1
See application file for complete search history.

(56) References Cited

U.S. PATENT DOCUMENTS

2011/0135118 A1    6/2011  Osborne
2017/0346450 A1*  11/2017  De Vries ............... H03F 1/3211
2018/0084325 A1    3/2018  Goeke

* cited by examiner

PREAMPLIFIER SYSTEM

RELATED APPLICATION(S)

This application claims the benefit of U.S. Provisional Application No. 63/492,705, filed on 28 Mar. 2023, the entire contents of which are incorporated herein by reference.

TECHNICAL FIELD

This disclosure relates to preamplifier systems and, more particularly, to low-noise preamplifier systems.

BACKGROUND

Preamplifiers play an essential role in the world of audio recording and reinforcement, particularly when it comes to handling microphone signals. Microphones convert sound waves into electrical signals, but these signals are typically very weak, known as "mic level" signals, and are prone to noise and quality degradation over distance. The primary function of a preamplifier is to amplify these mic level signals to a more robust "line level" without significantly compromising the signal-to-noise ratio. This is crucial for maintaining signal integrity over long cable runs and through various audio equipment.

Moreover, preamplifiers serve to match the impedance between microphones and subsequent audio devices. Microphones usually have a low output impedance, and without proper matching through a preamplifier, there's a risk of signal loss or distortion when connecting to devices with higher input impedance. Many preamplifiers also offer balanced inputs and outputs, which are vital for minimizing noise and interference in professional audio settings.

Aside from their core amplification duty, preamplifiers often come with additional features for tone shaping and control. These can include gain control, which adjusts the level of signal amplification, and phantom power, a necessity for condenser microphones that require external power. Some preamplifiers also offer low-cut filters, phase inversion, and EQ settings, allowing audio engineers to tweak the microphone signal at the very start of the audio path for optimal sound quality.

In essence, preamplifiers are critical for elevating the microphone's low-level signals to a point where they can be effectively used with other audio equipment, ensuring the sound captured is as faithful to the original source as possible. By providing necessary gain, facilitating impedance matching, and allowing for early signal conditioning, preamplifiers set the stage for high-quality audio recordings and sound reinforcement systems.

SUMMARY OF DISCLOSURE

In one implementation, a noise-reducing preamp system includes: a power supply circuit configured to provide electrical power to the noise-reducing preamp system and including a 0 volt reference; a signal amplification circuit including: a preamplifier circuit having an external reference input terminal and configured to receive an analog input signal, and a variable gain controller circuit configured to control the gain of the preamplifier circuit, wherein the signal amplification circuit is configured to amplify the analog input signal to generate an analog amplified signal; and a DC offset and biasing circuit coupled to the preamplifier circuit and the 0 volt reference of the power supply circuit, the DC offset and biasing circuit configured to: receive the 0 volt reference as a feedback signal, process the analog amplified signal to remove a DC offset and generate an analog output signal, and provide the analog output signal to the external reference input terminal of the preamplifier circuit of the signal amplification circuit; wherein the noise-reducing preamp system is configured to provide the analog amplified signal to an external device.

One or more of the following features may be included. A plurality of input channels may be configured to receive a plurality of analog input signals from an external input device. The external input device may include a pro-audio microphone. The plurality of analog input signals may include: a hot analog input signal; and a cold analog input signal. The signal amplification circuit may be configured to process the plurality of analog input signals to generate a plurality of analog amplified signals. A plurality of output channels may be configured to provide the plurality of analog amplified signals to an external output device. The external output device may include a mixing board. The variable gain controller circuit may include: a multi-position selector switch that allows a user to select from a plurality of predefined signal gains. The variable gain controller circuit may include: a first variable gain controller circuit configured to control the gain of a first analog input signal; and a second variable gain controller circuit configured to control the gain of a second analog input signal. The first variable gain controller circuit and the second variable gain controller circuit may be coupled together so that the first variable gain controller circuit and the second variable gain controller circuit are set to the same predefined signal gain.

In another implementation, a noise-reducing preamp system includes: a power supply circuit configured to provide electrical power to the noise-reducing preamp system and including a 0 volt reference; a signal amplification circuit including: a preamplifier circuit having an external reference input terminal and configured to receive an analog input signal, and a variable gain controller circuit configured to control the gain of the preamplifier circuit, the variable gain controller circuit including a multi-position selector switch that allows a user to select from a plurality of predefined signal gains, wherein the signal amplification circuit is configured to amplify the analog input signal to generate an analog amplified signal; and a DC offset and biasing circuit coupled to the preamplifier circuit and the 0 volt reference of the power supply circuit, the DC offset and biasing circuit configured to: receive the 0 volt reference as a feedback signal, process the analog amplified signal to remove a DC offset and generate an analog output signal, and provide the analog output signal to the external reference input terminal of the preamplifier circuit of the signal amplification circuit; wherein the noise-reducing preamp system is configured to provide the analog amplified signal to an external device.

One or more of the following features may be included. The variable gain controller circuit may include: a first variable gain controller circuit configured to control the gain of a first analog input signal; and a second variable gain controller circuit configured to control the gain of a second analog input signal. The first variable gain controller circuit and the second variable gain controller circuit may be coupled together so that the first variable gain controller circuit and the second variable gain controller circuit are set to the same predefined signal gain. A plurality of input channels may configured to receive a plurality of analog input signals from an external input device. The signal amplification circuit may be configured to process the plurality of analog input signals to generate a plurality of analog amplified signals. A plurality of output channels may configured to provide the plurality of analog amplified signals to an external output device.

In another implementation, a noise-reducing preamp system includes: a plurality of input channels configured to receive a plurality of analog input signals from an external input device; a power supply circuit configured to provide electrical power to the noise-reducing preamp system and including a 0 volt reference; a signal amplification circuit including: a preamplifier circuit having a plurality of external reference input terminals and configured to receive the plurality of analog input signals, and a variable gain controller circuit configured to control the gain of the preamplifier circuit, wherein the signal amplification circuit is configured to amplify the plurality of analog input signals to generate a plurality of analog amplified signals; a DC offset and biasing circuit coupled to the preamplifier circuit and the 0 volt reference of the power supply circuit, the DC offset and biasing circuit configured to: receive the 0 volt reference as a feedback signal, process the plurality of analog amplified signals to remove a DC offset and generate a plurality of analog output signals, and provide the plurality of analog output signals to the plurality of external reference input terminals of the preamplifier circuit of the signal amplification circuit; and a plurality of output channels configured to provide the plurality of analog amplified signals to an external output device.

One or more of the following features may be included. The external input device may include a pro-audio microphone. The plurality of analog input signals may include: a hot analog input signal; and a cold analog input signal. The external output device may include a mixing board. The variable gain controller circuit may include: a multi-position selector switch that allows a user to select from a plurality of predefined signal gains. The variable gain controller circuit may include: a first variable gain controller circuit configured to control the gain of a first analog input signal; and a second variable gain controller circuit configured to control the gain of a second analog input signal. The first variable gain controller circuit and the second variable gain controller circuit may be coupled together so that the first variable gain controller circuit and the second variable gain controller circuit are set to the same predefined signal gain.

The details of one or more implementations are set forth in the accompanying drawings and the description below. Other features and advantages will become apparent from the description, the drawings, and the claims.

BRIEF DESCRIPTION OF THE DRAWINGS

Like reference symbols in the various drawings indicate like elements.

DETAILED DESCRIPTION OF THE PREFERRED EMBODIMENTS

Figure 1:
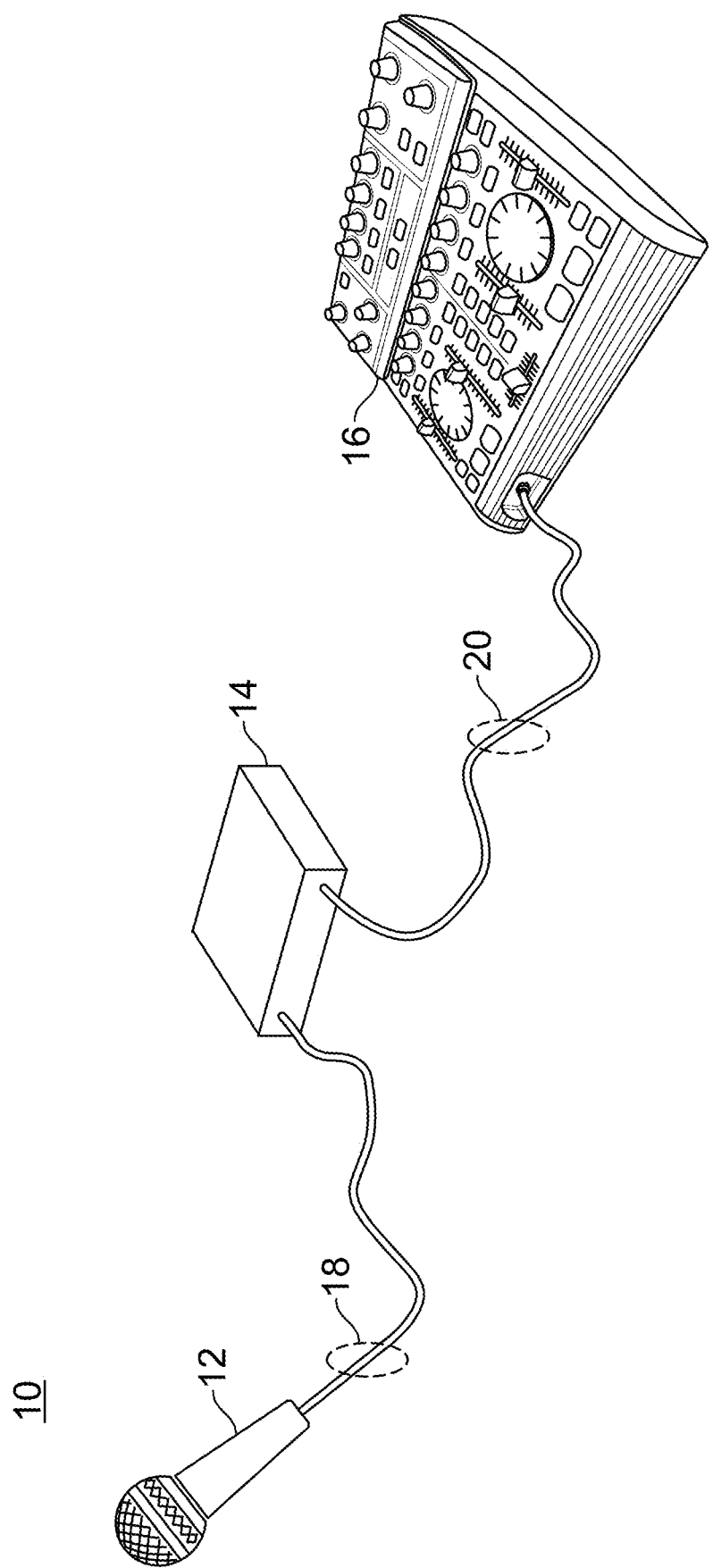
FIG. 1 is a diagrammatic view of various pieces of audio equipment including a preamplifier system.

Referring to FIG. 1, there is shown a pro-audio setup (e.g., pro-audio setup 10). In a recording environment, a microphone (e.g., microphone 12), a preamplifier system (e.g., noise-reducing preamp system 14), and a mixing board (e.g., mixing board 16) may be utilized to capture and refine sound with high fidelity.

The setup (e.g., pro-audio setup 10) begins with the microphone (e.g., microphone 12), which serves as the initial point of contact for sound waves. Microphones, varying in types such as dynamic, condenser, or ribbon, are selected based on the specific characteristics of the sound source and the desired tonal qualities. The captured audio signal by the microphone (e.g., microphone 12) may be inherently weak and, hence, requires amplification. This is where the preamplifier system (e.g., noise-reducing preamp system 14) comes into play. The preamplifier system (e.g., noise-reducing preamp system 14) amplifies the mic-level signal (e.g., analog input signal 18) to a line-level signal (e.g., analog amplified signal 20), ensuring the signal is robust enough for further processing while minimizing noise and maintaining quality, which is highly important in professional settings (where clarity and signal integrity are paramount).

Moreover, the preamplifier system (e.g., noise-reducing preamp system 14) may include additional features such as gain control, phantom power for condenser microphones, and sometimes tone-shaping options like EQ settings or filters. These features may allow for preliminary adjustments to the signal (e.g., analog input signal 18), optimizing the signal (e.g., analog input signal 18) before it reaches the mixing stage. After amplification and initial processing, the signal (e.g., analog amplified signal 20) is then routed to a mixing board (e.g., mixing board 16). The mixing board (e.g., mixing board 16) may act as the central hub for signal routing and further refining. At the mixing board (e.g., mixing board 16), each input may be adjusted for volume, pan, and additional EQ settings. The mixing board (e.g., mixing board 16) may also include connections for external effects, bus groups for combining multiple channels, and master controls for the overall output.

The mic-level signal (e.g., analog input signal 18) and the line-level signal (e.g., analog amplified signal 20) may be carried on an XLR cable. An XLR cable is a type of electrical connector primarily used in professional audio, video, and stage lighting equipment. Characterized by its resilience and balanced audio capabilities, the XLR cable ensures high-quality signal transmission by reducing noise and interference, making it popular in live sound setups, recording studios, and broadcast applications. The design typically features three to seven pins or holes, with the three-pin configuration being the most common. This trio of pins carries the positive (i.e., hot), the negative (i.e., cold), and the ground signals (respectively), which helps in canceling out noise by allowing the equipment to differentiate between the intended audio signal and any noise that has been induced along the cable's length. XLR cables are favored for their durability and superior sound quality, making them the preferred choice for microphones, mixers, audio interfaces, and other professional audio equipment where maintaining signal integrity is crucial.

Figure 2:
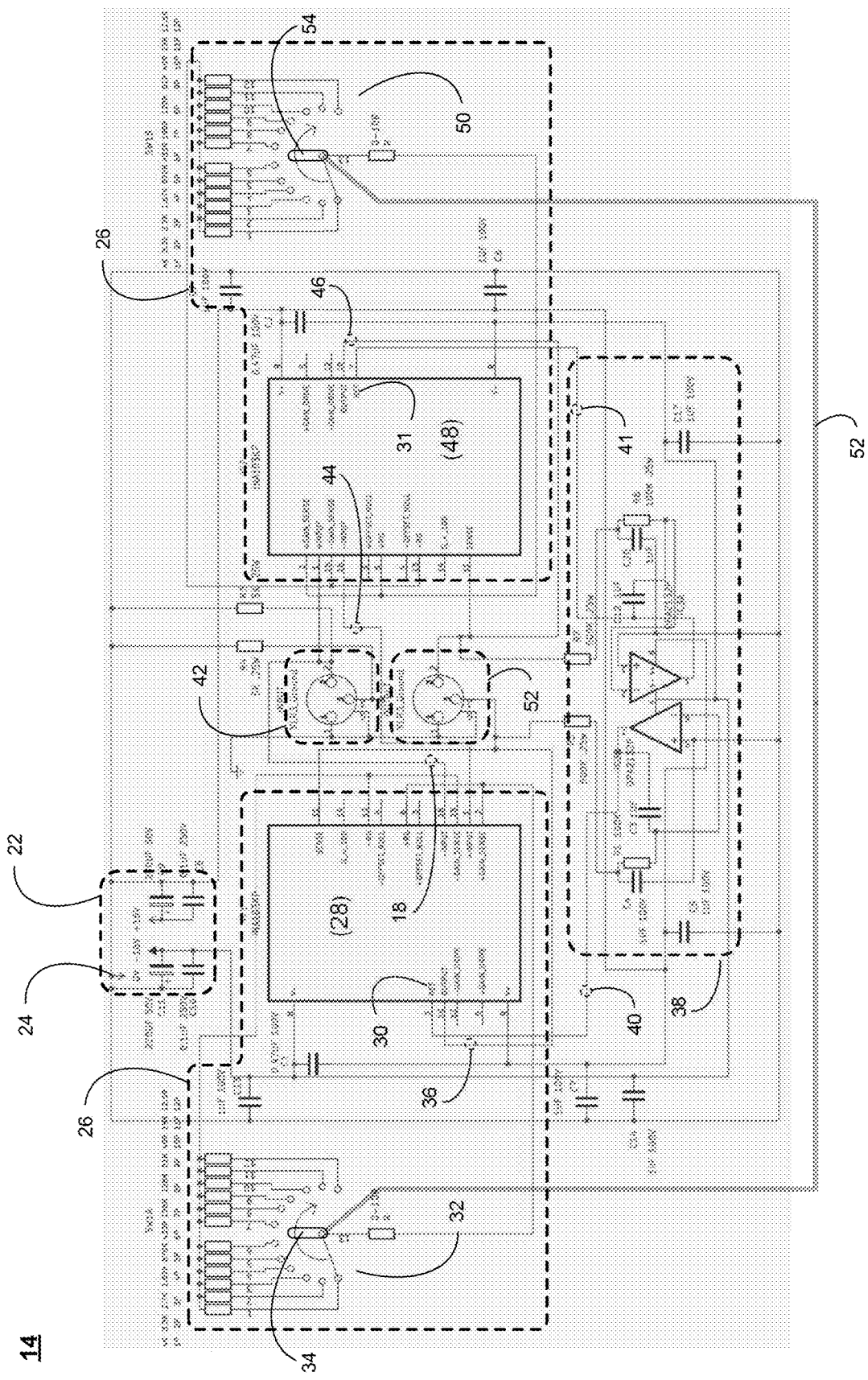
FIG. 2 is a schematic view of the preamplifier system of FIG. 1 according to an embodiment of the present disclosure.

Preamplifier Overview:

Referring to FIG. 2, there is shown a schematic diagram of one implementation of the preamplifier system (e.g., noise-reducing preamp system 14).

The preamplifier system (e.g., noise-reducing preamp system 14) may include a power supply circuit (e.g., power supply circuit 22) that may be configured to provide electrical power (e.g., #16 VDC) to the preamplifier system (e.g., noise-reducing preamp system 14). The power supply circuit (e.g., power supply circuit 22) may also include a 0 volt reference (e.g., 0 volt reference 24).

A power supply circuit (e.g., power supply circuit 22) with a zero-volt reference (e.g., 0 volt reference 24) is designed to provide stable DC output voltages that include a reference point explicitly defined as zero volts. This zero volt reference (e.g., 0 volt reference 24) may be crucial in electronic circuits as it provides a common point of reference for measuring and establishing voltages within the circuit. The inclusion of a zero-volt reference (e.g., 0 volt reference 24) in a power supply circuit (e.g., power supply circuit 22) ensures that all voltages supplied to the connected electronic devices or circuits are referenced to a common zero volt reference (e.g., 0 volt reference 24), enabling consistent and reliable operation.

The concept of a zero-volt reference (e.g., 0 volt reference 24) is integral to both the design and functionality of electronic systems, serving several key purposes:

Voltage Reference: It establishes a stable reference point against which all other voltages in the system are measured. This is essential for the accurate operation of digital and analog circuits, where voltage levels often determine logic states or analog signal levels.

Signal Integrity: Having a common ground helps in maintaining signal integrity across various components and systems by providing a return path for current. This is particularly important in complex systems where multiple devices need to communicate or operate in synchronization.

Safety: The zero-volt reference can also be connected to the physical ground (earth) in many systems, providing a path for fault currents to safely dissipate into the earth in the event of a short circuit or other malfunction, thereby protecting the user and equipment.

In a power supply circuit (e.g., power supply circuit 22), achieving a zero-volt reference (e.g., 0 volt reference 24) typically involves the careful design of the circuit topology, including the arrangement of transformers, rectifiers, filtering components, and voltage regulators. The ground plane on a circuit board, which connects to the zero-volt reference (e.g., 0 volt reference 24), is designed to ensure it is capable of handling the return current without introducing significant voltage drops or noise into the system.

In practice, a power circuit (e.g., power supply circuit 22) with a zero-volt reference (e.g., 0 volt reference 24) may provide multiple output voltages all referenced to the same ground, enabling the power supply to support a wide range of components and circuits that require different operating voltages. Such power supplies are fundamental in computers, communication devices, and many other electronic products, where multiple voltage levels are needed, all referenced to a common ground for operational integrity and safety.

The preamplifier system (e.g., noise-reducing preamp system 14) may include a signal amplification circuit (e.g., signal amplification circuit 26).

The signal amplification circuit (e.g., signal amplification circuit 26) may include a preamplifier circuit (e.g., preamplifier circuit 28) having an external reference input terminal (e.g., external reference input terminal 30) and configured to receive an analog input signal (e.g., analog input signal 18). One such example of the preamplifier circuit (e.g., preamplifier circuit 28) may include a Texas Instruments INA103KP Low Noise, Low Distortion Instrumentation Amplifier. While the signal amplification circuit (e.g., signal amplification circuit 26) is shown to be an integrated circuit in this particular implementation, it is understood that the signal amplification circuit (e.g., signal amplification circuit 26) may be any amplification circuit, including one that is constructed of discrete electronic components.

The signal amplification circuit (e.g., signal amplification circuit 26) may include a variable gain controller circuit (e.g., variable gain controller circuit 32) configured to control the gain of the preamplifier circuit (e.g., preamplifier circuit 28). For example, the variable gain controller circuit (e.g., variable gain controller circuit 32) may allow a user to select for one of a plurality of predefined gain settings. Accordingly, the variable gain controller circuit (e.g., variable gain controller circuit 32) may be a multi-position selector switch with which a user may select (e.g., via knob 34) the desired gain for analog input signal 18 from the plurality of predefined gain settings.

The signal amplification circuit (e.g., signal amplification circuit 26) may be configured to amplify the analog input signal (e.g., analog input signal 18) to generate an analog amplified signal (e.g., analog amplified signal 36).

The preamplifier system (e.g., noise-reducing preamp system 14) may include a DC offset and biasing circuit (e.g., DC offset and biasing circuit 38) coupled to the preamplifier circuit (e.g., preamplifier circuit 28) and the 0 volt reference (e.g., 0 volt reference 24) of the power supply circuit (e.g., power supply circuit 22). As will be discussed below in greater detail, the DC offset and biasing circuit (e.g., DC offset and biasing circuit 38) may perform "servo offsetting" to remove/mitigate DC offset.

A DC offset refers to a constant voltage component present in an electrical signal, typically in addition to any alternating current (AC) component. This offset creates a shift in the signal's voltage level compared to a reference point, often zero volts. In practical terms, a signal with a DC offset appears shifted either positively or negatively along the voltage axis.

DC offsets can arise due to various factors, including imperfections in electronic components, asymmetries in amplifier stages, or intentional biasing (i.e., offset) techniques. Generally speaking, amplifiers (e.g., IC-based, transistor-based) are powered by DC and these are the induced DC voltages that need to be removed from the AC audio path. While small DC offsets (or intentional DC offsets) may not pose issues in some applications, they may cause problems in others. For example, in audio systems, DC offsets can lead to audible distortion, inefficient power utilization, or even damage to speakers or headphones.

A DC offset and biasing circuit (e.g., DC offset and biasing circuit 38) is an electronic circuit designed to mitigate or eliminate unwanted DC voltages from an electrical signal. These circuits are employed in various applications where DC offsets can cause issues. The primary goal of a DC offset and biasing circuit (e.g., DC offset and biasing circuit 38) is to restore the signal to its intended form, often centered around a zero-volt reference.

There are several methods for removing DC offsets from a signal:

Coupling Capacitors: Capacitor coupling is one of the simplest and most widely used methods for blocking DC while allowing AC signals to pass through. In this method, a capacitor is placed in series with the input or output of the circuit. The capacitor blocks the DC component of the signal while allowing the AC component to pass through unaffected. However, coupling capacitors may introduce limitations such as frequency response variations and distortion at low frequencies.

DC Servo Circuits: DC servo circuits actively nullify the DC offset by generating a compensating voltage that cancels out the unwanted DC component. These circuits typically use feedback loops and amplifiers to continuously monitor the output voltage and adjust it to maintain the desired zero-volt reference. DC servo circuits are commonly used in precision instrumentation and audio equipment where accurate DC offset removal is critical.

Differential Amplifiers: Differential amplifiers, also known as difference amplifiers, are capable of amplifying the voltage difference between two input signals while rejecting common-mode signals, including DC offsets. By using a differential amplifier configured to amplify only the AC component of the signal, DC offsets can be effectively removed. This approach is commonly used in instrumentation and measurement applications.

Active Filters: Active filter circuits, such as high-pass filters or notch filters, can be used to attenuate or remove specific frequency components, including DC offsets, from a signal. These circuits typically use operational amplifiers and passive components to selectively filter out unwanted frequencies while preserving the desired signal bandwidth.

Auto-Zeroing Techniques: Some precision analog-to-digital converters (ADCs) and instrumentation amplifiers incorporate auto-zeroing techniques to eliminate DC offsets. These techniques involve periodically measuring and correcting for any offset errors introduced by the circuitry, ensuring accurate signal acquisition and processing.

DC offset and biasing circuit (e.g., DC offset and biasing circuit 38) are crucial for maintaining signal integrity and preventing distortion in electronic systems. The choice of circuit topology and implementation method depends on factors such as the required precision, bandwidth, and complexity of the application.

The DC offset and biasing circuit (e.g., DC offset and biasing circuit 38) may be configured to: receive the 0 volt reference (e.g., 0 volt reference 24) as a feedback signal; process the analog amplified signal (e.g., analog amplified signal 36) to remove a DC offset and generate an analog output signal (e.g., analog output signal 40); and provide the analog output signal (e.g., analog output signal 40) to the external reference input terminal (e.g., external reference input terminal 30) of the preamplifier circuit (e.g., preamplifier circuit 28) of the signal amplification circuit (e.g., signal amplification circuit 26).

The DC offset and biasing circuit (e.g., DC offset and biasing circuit 38) may be implemented using one or more operational amplifier circuits, wherein the 0 volt reference (e.g., 0 volt reference 24) and the analog amplified signal (e.g., analog amplified signal 36) are provided to the input terminals of the operational amplifier circuits.

An operational amplifier (op-amp) is a fundamental electronic component extensively used in analog circuitry. It serves as a high-gain voltage amplifier, featuring two input terminals (inverting and non-inverting), one output terminal, and often additional power supply connections. With gain levels ranging from tens of thousands to millions, op-amps are renowned for their ability to amplify even minute voltage differences between the input terminals, making them invaluable in amplifying weak signals for further processing.

These components possess distinctive characteristics, including differential inputs represented by the inverting (−) and non-inverting (+) terminals, where the output voltage is directly proportional to the voltage discrepancy between these inputs. Ideal op-amps exhibit infinite input impedance, drawing negligible current from input sources, and minimal output impedance, facilitating direct load driving without significant distortion. Their linear operation within a specific range allows for predictable and proportional output responses to input voltages, making them versatile for various signal processing tasks.

Op-amps find extensive application across electronics, employed in amplifiers, filters, oscillators, comparators, voltage regulators, and more. Available as integrated circuits (ICs), they offer convenience in circuit design and come in diverse configurations to suit different needs.

The preamplifier system (e.g., noise-reducing preamp system 14) may be configured to provide the analog amplified signal (e.g., analog output signal 40) to an external device (e.g., mixing board 16).

Multi-Channel Operation:

While the overview provided above discusses various circuits that are used to process a single signal, this is for illustrative purposes only and is not intended to be a limitation of this disclosure, as other configurations are possible and are considered to be within the scope of this disclosure.

As discussed above, the mic-level signal (e.g., analog input signal 18) and the line-level signal (e.g., analog amplified signal 20) may be carried on a multi-conductor XLR cable. An XLR cable is a type of electrical connector primarily used in professional audio, video, and stage lighting equipment. Characterized by its resilience and balanced audio capabilities, the XLR cable ensures high-quality signal transmission by reducing noise and interference, making it popular in live sound setups, recording studios, and broadcast applications. The design typically features three to seven pins or holes, with the three-pin configuration being the most common. This trio of pins carries the positive (i.e., hot), the negative (i.e., cold), and the ground signals (respectively), which helps in canceling out noise by allowing the equipment to differentiate between the intended audio signal and any noise that has been induced along the cable's length. For the following example, assume that a three-conductor XLR cable is utilized to carry a plurality of analog input signals, examples of which may include but are not limited to a positive signal (i.e., a hot analog input signal), a negative signal (i.e., a cold analog input signal), and a ground signal.

Accordingly and for the following example, assume that the preamplifier system (e.g., noise-reducing preamp system 14) includes: a plurality of input channels (e.g., input channels 42) configured to receive a plurality of analog input signals (e.g., analog input signals 18, 44) from an external input device. Examples of such an external input device may include but is not limited to a pro-audio microphone (e.g., microphone 12). In this example, such a pro-audio microphone (e.g., microphone 12) may utilize an XLR cable to couple the pro-audio microphone (e.g., microphone 12) to the preamplifier system (e.g., noise-reducing preamp system 14).

Accordingly and in this example, the signal amplification circuit (e.g., signal amplification circuit 26) may be configured to process the plurality of analog input signals (e.g., analog input signals 18, 44) to generate a plurality of analog amplified signals (e.g., plurality of analog amplified signals 36, 46). For example, the signal amplification circuit (e.g., signal amplification circuit 26) may be a multipart circuit, each of which includes a preamplifier circuit (e.g., preamplifier circuit 28, 48) and a variable gain controller circuit (e.g., variable gain controller circuit 32, 50). Further and in such a multi-channel configuration, the DC offset and biasing circuit (e.g., DC offset and biasing circuit 38) may be configured to: receive the 0 volt reference (e.g., 0 volt reference 24) as a feedback signal; process the analog amplified signals (e.g., analog amplified signals 36, 46) to remove a DC offset and generate analog output signals (e.g., analog output signals 40, 41); and provide the analog output signals (e.g., analog output signals 40, 41) to the external reference input terminals (e.g., external reference input terminals 30, 31) of the preamplifier circuits (e.g., preamplifier circuits 28, 48) of the signal amplification circuit (e.g., signal amplification circuit 26).

The preamplifier system (e.g., noise-reducing preamp system 14) may include a plurality of output channels (e.g., output channels 52) configured to provide the plurality of analog amplified signals (e.g., plurality of analog amplified signals 36, 46) to an external output device. Examples of such an external output device may include but is not limited to a mixing board (e.g., mixing board 16).

As discussed above, the variable gain controller circuit (e.g., variable gain controller circuit 32, 50) may include: a multi-position selector switch that allows a user to select (e.g., via knob 34, 54) the desired gain for analog input signals 18, 44 from the plurality of predefined gain settings.

In such a multi-channel configuration, the variable gain controller circuit (e.g., variable gain controller circuit 32, 50) may include: a first variable gain controller circuit (e.g., variable gain controller circuit 32) configured to control the gain of a first analog input signal (e.g., analog input signal 18); and a second variable gain controller circuit (e.g., variable gain controller circuit 50) configured to control the gain of a second analog input signal (e.g., analog input signal 44); wherein the first variable gain controller circuit (e.g., variable gain controller circuit 32) and the second variable gain controller circuit (e.g., variable gain controller circuit 50) are coupled together so that the first variable gain controller circuit (e.g., variable gain controller circuit 32) and the second variable gain controller circuit (e.g., variable gain controller circuit 50) are set to the same predefined signal gain. Such a configuration may be accomplished by having the variable gain controller circuits (e.g., variable gain controller circuit 32, 50) operated/manipulated via a single selector shaft (e.g., single selector shaft 52).

System Overview:

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. A noise-reducing preamp system comprising:
   a power supply circuit configured to provide electrical power to the noise-reducing preamp system and including a 0 volt reference;
   a signal amplification circuit including:
      a preamplifier circuit having an external reference input terminal and configured to receive an analog input signal, and
      a variable gain controller circuit configured to control the gain of the preamplifier circuit,
      wherein the signal amplification circuit is configured to amplify the analog input signal to generate an analog amplified signal; and
   a DC offset and biasing circuit coupled to the preamplifier circuit and the 0 volt reference of the power supply circuit, the DC offset and biasing circuit configured to:
      receive the 0 volt reference as a feedback signal,
      process the analog amplified signal to remove a DC offset and generate an analog output signal, and
      provide the analog output signal to the external reference input terminal of the preamplifier circuit of the signal amplification circuit;
   wherein the noise-reducing preamp system is configured to provide the analog amplified signal to an external device.

2. The noise-reducing preamp system of claim 1 further comprising:
   a plurality of input channels configured to receive a plurality of analog input signals from an external input device.

3. The noise-reducing preamp system of claim 2 wherein the external input device includes a pro-audio microphone.

4. The noise-reducing preamp system of claim 3 wherein the plurality of analog input signals includes:
   a hot analog input signal; and
   a cold analog input signal.

5. The noise-reducing preamp system of claim 4 further comprising:
   a plurality of output channels configured to provide the plurality of analog amplified signals to an external output device.

6. The noise-reducing preamp system of claim 5 wherein the external output device includes a mixing board.

7. The noise-reducing preamp system of claim 2 wherein the signal amplification circuit is configured to process the plurality of analog input signals to generate a plurality of analog amplified signals.

8. The noise-reducing preamp system of claim 1 wherein the variable gain controller circuit includes:
   a multi-position selector switch that allows a user to select from a plurality of predefined signal gains.

9. The noise-reducing preamp system of claim 1 wherein the variable gain controller circuit includes:
   a first variable gain controller circuit configured to control the gain of a first analog input signal; and
   a second variable gain controller circuit configured to control the gain of a second analog input signal.

10. The noise-reducing preamp system of claim 9 wherein the first variable gain controller circuit and the second variable gain controller circuit are coupled together so that the first variable gain controller circuit and the second variable gain controller circuit are set to the same predefined signal gain.

11. A noise-reducing preamp system comprising:
a power supply circuit configured to provide electrical power to the noise-reducing preamp system and including a 0 volt reference;
a signal amplification circuit including:
  a preamplifier circuit having an external reference input terminal and configured to receive an analog input signal, and
  a variable gain controller circuit configured to control the gain of the preamplifier circuit, the variable gain controller circuit including a multi-position selector switch that allows a user to select from a plurality of predefined signal gains,
  wherein the signal amplification circuit is configured to amplify the analog input signal to generate an analog amplified signal; and
a DC offset and biasing circuit coupled to the preamplifier circuit and the 0 volt reference of the power supply circuit, the DC offset and biasing circuit configured to:
  receive the 0 volt reference as a feedback signal,
  process the analog amplified signal to remove a DC offset and generate an analog output signal, and
  provide the analog output signal to the external reference input terminal of the preamplifier circuit of the signal amplification circuit;
wherein the noise-reducing preamp system is configured to provide the analog amplified signal to an external device.

12. The noise-reducing preamp system of claim 11 wherein the variable gain controller circuit includes:
a first variable gain controller circuit configured to control the gain of a first analog input signal; and
a second variable gain controller circuit configured to control the gain of a second analog input signal.

13. The noise-reducing preamp system of claim 12 wherein the first variable gain controller circuit and the second variable gain controller circuit are coupled together so that the first variable gain controller circuit and the second variable gain controller circuit are set to the same predefined signal gain.

14. The noise-reducing preamp system of claim 11 further comprising:
a plurality of input channels configured to receive a plurality of analog input signals from an external input device.

15. The noise-reducing preamp system of claim 14 wherein the signal amplification circuit is configured to process the plurality of analog input signals to generate a plurality of analog amplified signals.

16. The noise-reducing preamp system of claim 14 further comprising:
a plurality of output channels configured to provide the plurality of analog amplified signals to an external output device.

17. A noise-reducing preamp system comprising:
a plurality of input channels configured to receive a plurality of analog input signals from an external input device;
a power supply circuit configured to provide electrical power to the noise-reducing preamp system and including a 0 volt reference;
a signal amplification circuit including:
  a preamplifier circuit having a plurality of external reference input terminals and configured to receive the plurality of analog input signals, and
  a variable gain controller circuit configured to control the gain of the preamplifier circuit,
  wherein the signal amplification circuit is configured to amplify the plurality of analog input signals to generate a plurality of analog amplified signals;
a DC offset and biasing circuit coupled to the preamplifier circuit and the 0 volt reference of the power supply circuit, the DC offset and biasing circuit configured to:
  receive the 0 volt reference as a feedback signal,
  process the plurality of analog amplified signals to remove a DC offset and generate a plurality of analog output signals, and
  provide the plurality of analog output signals to the plurality of external reference input terminals of the preamplifier circuit of the signal amplification circuit; and
a plurality of output channels configured to provide the plurality of analog amplified signals to an external output device.

18. The noise-reducing preamp system of claim 17 wherein the external input device includes a pro-audio microphone.

19. The noise-reducing preamp system of claim 18 wherein the plurality of analog input signals includes:
a hot analog input signal; and
a cold analog input signal.

20. The noise-reducing preamp system of claim 17 wherein the external output device includes a mixing board.

21. The noise-reducing preamp system of claim 17 wherein the variable gain controller circuit includes:
a multi-position selector switch that allows a user to select from a plurality of predefined signal gains.

22. The noise-reducing preamp system of claim 17 wherein the variable gain controller circuit includes:
a first variable gain controller circuit configured to control the gain of a first analog input signal; and
a second variable gain controller circuit configured to control the gain of a second analog input signal.

23. The noise-reducing preamp system of claim 22 wherein the first variable gain controller circuit and the second variable gain controller circuit are coupled together so that the first variable gain controller circuit and the second variable gain controller circuit are set to the same predefined signal gain.

* * * * *